United States Patent
Onuma et al.

(10) Patent No.: US 10,305,675 B2
(45) Date of Patent: May 28, 2019

(54) DATA PHASE TRACKING DEVICE, DATA PHASE TRACKING METHOD AND COMMUNICATION DEVICE

(71) Applicants: NTT ELECTRONICS CORPORATION, Yokohama-shi, Kanagawa (JP); NIPPON TELEGRAPH AND TELEPHONE CORPORATION, Tokyo (JP)

(72) Inventors: Yasuharu Onuma, Kanagawa (JP); Masahiro Tachibana, Kanagawa (JP); Etsushi Yamazaki, Kanagawa (JP); Kazuhito Takei, Kanagawa (JP); Yuki Yoshida, Kanagawa (JP); Masayuki Ikeda, Kanagawa (JP); Yoshiaki Kisaka, Kanagawa (JP); Masahito Tomizawa, Kanagawa (JP)

(73) Assignees: NTT ELECTRONICS CORPORATION, Yokohama-Shi, Kanagawa (JP); NIPPON TELEGRAPH AND TELEPHONE CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/568,696

(22) PCT Filed: Jan. 16, 2017

(86) PCT No.: PCT/JP2017/001196
§ 371 (c)(1),
(2) Date: Oct. 23, 2017

(87) PCT Pub. No.: WO2017/154351
PCT Pub. Date: Sep. 14, 2017

(65) Prior Publication Data
US 2018/0302211 A1 Oct. 18, 2018

(30) Foreign Application Priority Data

Mar. 8, 2016 (JP) ................................. 2016-044105

(51) Int. Cl.
*H04L 7/00* (2006.01)
*H04B 1/16* (2006.01)
(Continued)

(52) U.S. Cl.
CPC ............ *H04L 7/0079* (2013.01); *H03H 17/06* (2013.01); *H04B 1/16* (2013.01); *H04L 7/0029* (2013.01);
(Continued)

(58) Field of Classification Search
CPC ....... H04L 7/005; H04L 7/033; H04L 7/0331; H03H 17/06; H03H 2017/0081; H03H 17/0628
See application file for complete search history.

(56) References Cited

U.S. PATENT DOCUMENTS 6,057,789 A * 5/2000 Lin .......................... G06F 5/10
341/61
6,324,235 B1 * 11/2001 Savell ..................... H04L 25/05
375/372
(Continued)

FOREIGN PATENT DOCUMENTS

EP 0092400 A2 10/1983
JP 2004-260228 A 9/2004

OTHER PUBLICATIONS

Japanese Office Action of corresponding Japanese application No. 2016-044105 dated Apr. 4, 2017.
(Continued)

*Primary Examiner* — Aristocratis Fotakis
(74) *Attorney, Agent, or Firm* — Arent Fox LLP

(57) ABSTRACT

An FIR filter convolutes sampled data obtained by sampling a reception signal with tap coefficients. A phase difference
(Continued)

detector detects a phase difference between a synchronization timing of a signal waveform estimated from an output signal of the FIR filter and a sampling timing of the output signal. A tap coefficient adjuster adjusts the tap coefficients so as to reduce the phase difference detected by the phase difference detector and causes the sampling timing of the output signal of the FIR filter to track the synchronization timing.

16 Claims, 10 Drawing Sheets

(51) Int. Cl.
| | |
|---|---|
| H04L 7/033 | (2006.01) |
| H03H 17/06 | (2006.01) |
| H03H 17/00 | (2006.01) |
| H03H 17/08 | (2006.01) |

(52) U.S. Cl.
CPC ......... *H04L 7/033* (2013.01); *H03H 17/0027* (2013.01); *H03H 17/08* (2013.01); *H04L 7/005* (2013.01)

(56) References Cited

U.S. PATENT DOCUMENTS

| | | | | |
|---|---|---|---|---|
| 7,474,722 | B1* | 1/2009 | Chieng | H03F 3/217 375/355 |
| 7,551,909 | B1* | 6/2009 | Moon | H03L 7/0812 331/19 |
| 2002/0021519 | A1 | 2/2002 | Rae | |
| 2002/0075981 | A1* | 6/2002 | Tang | H04J 3/047 375/372 |
| 2002/0190880 | A1* | 12/2002 | McLaughlin | H03H 17/0628 341/61 |
| 2006/0077296 | A1* | 4/2006 | Gudmundson | H03L 7/06 348/497 |
| 2006/0188052 | A1* | 8/2006 | Mochizuki | G06F 5/12 375/372 |
| 2008/0124092 | A1* | 5/2008 | Dvir | H04L 7/0337 398/155 |
| 2012/0069941 | A1* | 3/2012 | Herbig | H04B 7/0851 375/347 |
| 2018/0175830 | A1* | 6/2018 | Onuma | H03H 17/0213 |

OTHER PUBLICATIONS

S. Suzuki et al. "R&D on the Digital Coherent Signal Processing Technology for Large-capacity Optical Communication Networks" The Journal of the Institue of Electronics, Information and Communication Engineers, vol. 95, No. 12, pp. 1100-1116, Dec. 2012.

Canadian Office Action issued in corresponding Canadian patent application No. 2,983,578 dated Aug. 2, 2018.

International Preliminary Report on Patentability issued in International Application PCT/JP2017/001196 dated Sep. 20, 2018.

Communication dated Nov. 20, 2018, in corresponding European Patent Application No. 17762697.5.

* cited by examiner

SECOND CLOCK C2 BEFORE WAVEFORM SHAPING

WAVEFORM SHAPED SECOND CLOCK C2

DATA PHASE TRACKING DEVICE, DATA PHASE TRACKING METHOD AND COMMUNICATION DEVICE

CROSS-REFERENCE TO RELATED APPLICATIONS

This application is a National Stage entry of International Application No. PCT/JP2017/001196, filed Jan. 16, 2017, which claims priority to Japanese Patent Application No. 2016-044105, filed Mar. 8, 2016. The disclosures of the priority applications are incorporated in their entirety herein by reference.

FIELD

The present invention relates to a data phase tracking device, a data phase tracking method and a communication device.

BACKGROUND

Following the recent spread of multimedia services and expansion of usage of ICT (Information and Communication Technology) services, Internet traffic flowing through a backbone network continues to increase year by year. Attention has been recently paid to a digital coherent technique as a next-generation optical communication technique for driving continuously increasing traffic (see NPL 1, for example). Introduction of the digital coherent technique makes it possible to correct distortion in a transmission path by digital signal processing, and thus makes it possible to perform high-precision dispersion compensation in a wide range. Furthermore, use of the digital coherent technique enables processing such as phase estimation and polarization split to be performed by digital signal processing, and techniques such as multilevel modulation, polarization multiplexing, etc. which have been difficult to be implemented have been widely used.

CITATION LIST

Non Patent Literature

NPL 1: Senta Suzuki and others, Summary Report "RESEARCH AND DEVELOPMENT ON THE DIGITAL COHERENT SIGNAL PROCESSING TECHNOLOGY FOR LARGE CAPACITY OF OPTICAL COMMUNICATION NETWORKS", Journal of the Institute of Electronics, Information and Communication Engineers, Vol. 95, No. 12, 2012, pp 1100 to 1116

SUMMARY

Technical Problem

In a conventional communication device, a clock of a reception signal is estimated from the reception signal, and a clock being in synchronization with the reception signal is reproduced by PLL (Phase Locked Loop) or the like. Sampling of the reception signal is performed using this clock. Accordingly, the conventional communication device requires not only a digital processing circuit, but also external circuits such as analog VCO (Voltage-Controlled Oscillator), a filter, and a D/A converter, which causes complication of the configuration and increase of the number of parts. Particularly, the analog VCO is more expensive and worse in noise characteristics than a fixed-frequency oscillator.

The present invention has been implemented in view of solving the foregoing problem, and has an object to provide a data phase tracking device, a data phase tracking method and a communication device that are capable of simplifying the device configuration.

Solution to Problem

A data phase tracking device according to the present invention includes: an FIR filter convoluting sampled data obtained by sampling a reception signal with tap coefficients; a phase difference detector detecting a phase difference between a synchronization timing of a signal waveform estimated from an output signal of the FIR filter and a sampling timing of the output signal; and a tap coefficient adjuster adjusting the tap coefficients so as to reduce the phase difference detected by the phase difference detector and causing the sampling timing of the output signal of the FIR filter to track the synchronization timing.

Advantageous Effects of Invention

The present invention makes it possible to simplify the device configuration.

DESCRIPTION OF EMBODIMENTS

A data phase tracking device, a data phase tracking method and a communication device according to the embodiments of the present invention will be described with reference to the drawings. The same components will be denoted by the same symbols, and the repeated description thereof may be omitted.

First Embodiment

Figure 1:
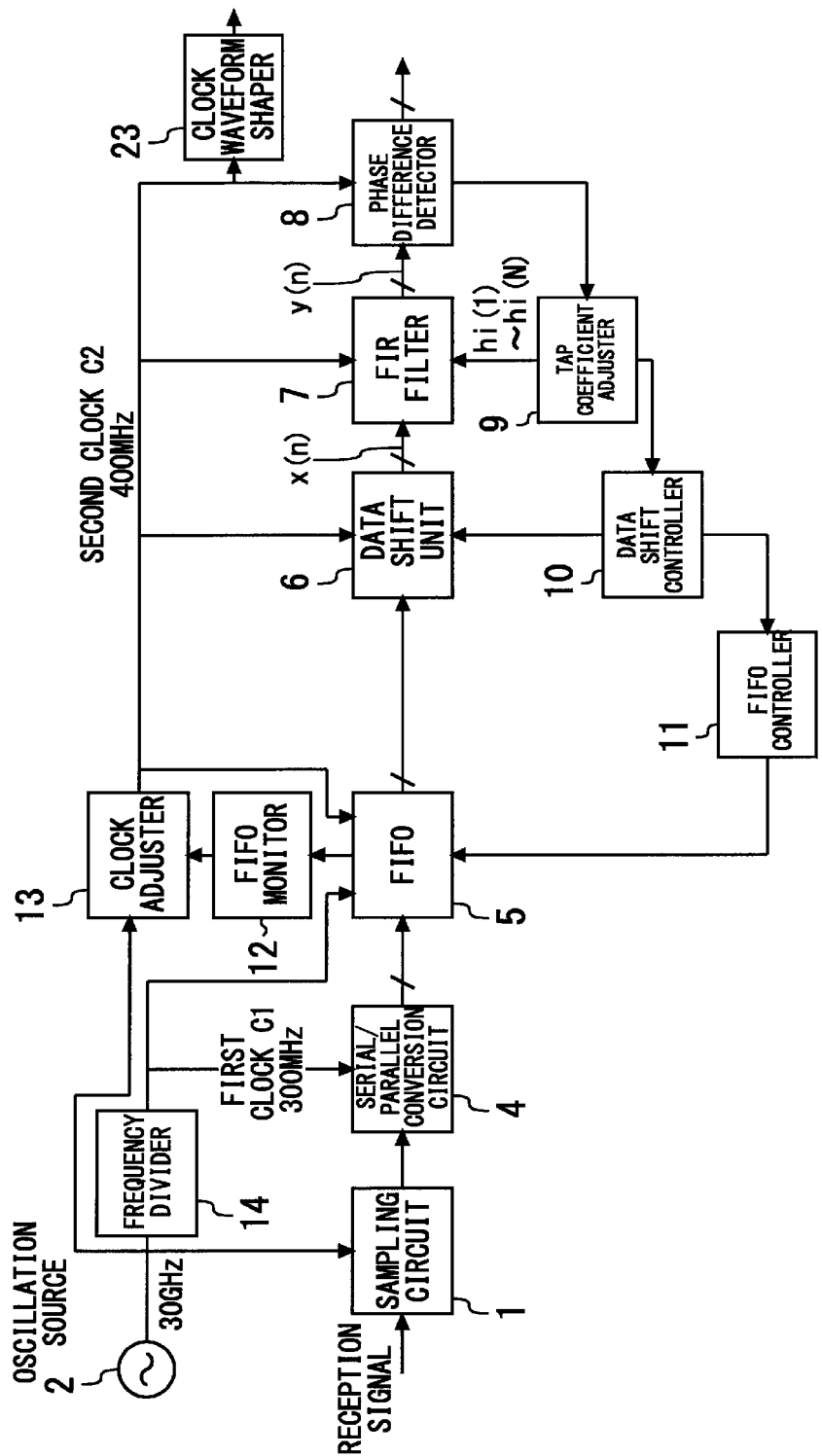
FIG. 1 is a diagram showing a data phase tracking device according to a first embodiment of the present invention.

FIG. 1 is a diagram showing a data phase tracking device according to a first embodiment of the present invention. A sampling circuit 1 samples a reception signal which is a high-frequency analog electrical signal in synchronization with an oscillation source from a fixed-frequency oscillator 2. A serial/parallel conversion circuit 4 converts the sampled data to parallel data, and outputs the parallel data in synchronization with a first clock C1. After FIFO (First In, First Out) 5 receives the sampled data converted to the parallel data in synchronization with the first clock C1 and stores the sampled data, FIFO 5 reads out the sampled data in synchronization with a second clock C2 and supplies the sampled data to a data shift unit 6. The sampled data passing through the data shift unit 6 is supplied to an FIR filter 7.

Figure 2:
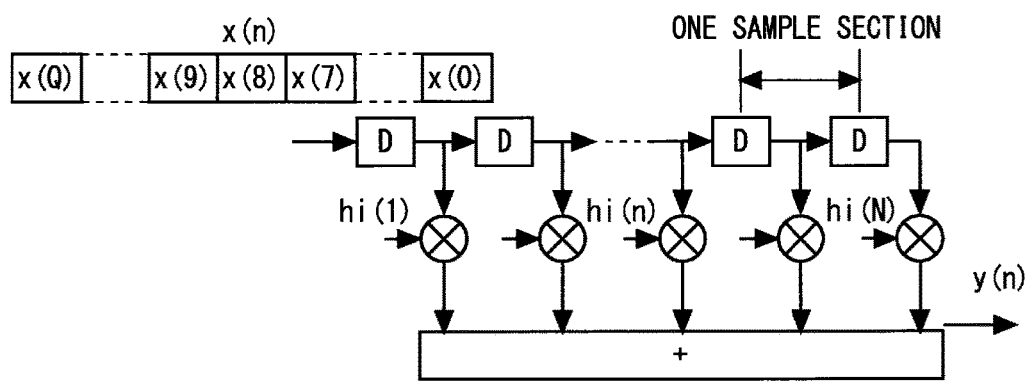
FIG. 2 is a diagram showing an FIR filter according to the first embodiment of the present invention.
Figure 3:
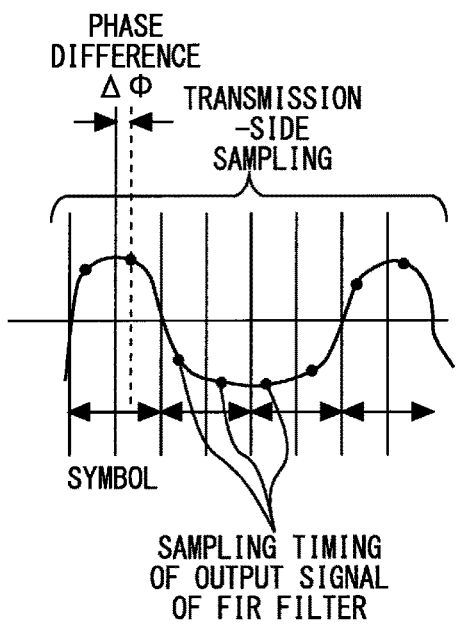
FIG. 3 is an explanatory diagram showing the operation of the FIR filter and a tap coefficient adjuster according to the first embodiment of the present invention.
Figure 4:
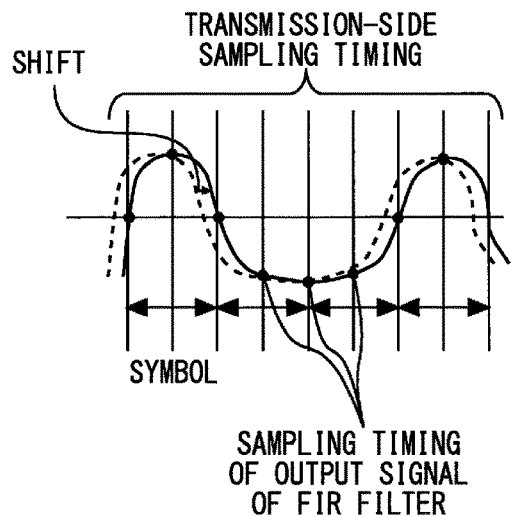
FIG. 4 is an explanatory diagram showing the operation of the FIR filter and a tap coefficient adjuster according to the first embodiment of the present invention.

FIG. 2 is a diagram showing an FIR filter according to the first embodiment of the present invention. FIGS. 3 and 4 are explanatory diagrams showing the operations of the FIR filter and a tap coefficient adjuster according to the first embodiment of the present invention. In synchronization with the second clock C2, the FIR filter 7 convolutes sampled data x(n) obtained by sampling the reception signal with tap coefficients hi(1) to hi(N) to generate an output signal y(n). As shown in FIG. 3, a phase difference exists between the synchronization timing (transmission-side sampling) by a signal waveform (the entire waveform of a transmission signal) estimated from the output signal of the FIR filter 7 and the sampling timing of the output signal. A phase difference detector 8 detects this phase difference. The tap coefficient adjuster 9 adjusts the tap coefficients so as to reduce the phase difference, thereby causing the sampling timing of the output signal of the FIR filter 7 to track the synchronization timing as shown in FIG. 4. The sampled data are supplied as parallel data, but phase tracking can be likewise performed by directly processing the convolution between the parallel data and the tap coefficients.

In general, by shifting the tap coefficients of the FIR filter 7 on a sample basis, an input signal can be advanced or delayed on a sample basis. In this case, by setting tap coefficients while shifting one sample section (the interval between adjacent samples) at an interval of 1/m, the input signal can be advanced or delayed at an interval of 1/m. That is, the tap coefficient adjuster 9 controls the tap coefficients to shift the phase of the output signal of the FIR filter 7 with accuracy smaller than one sample section. At this time, transmission-side sampling is not changed, so that the sampling timing of the output signal of the FIR filter 7 is enabled to track the synchronization timing for ideal decoding (transmission-side sampling). The frequency of the estimated signal waveform corresponds to the transmission-side data clock frequency, but phase tracking can be performed even when the second clock C2 does not have the same frequency as the transmission-side data clock frequency.

Figure 5:
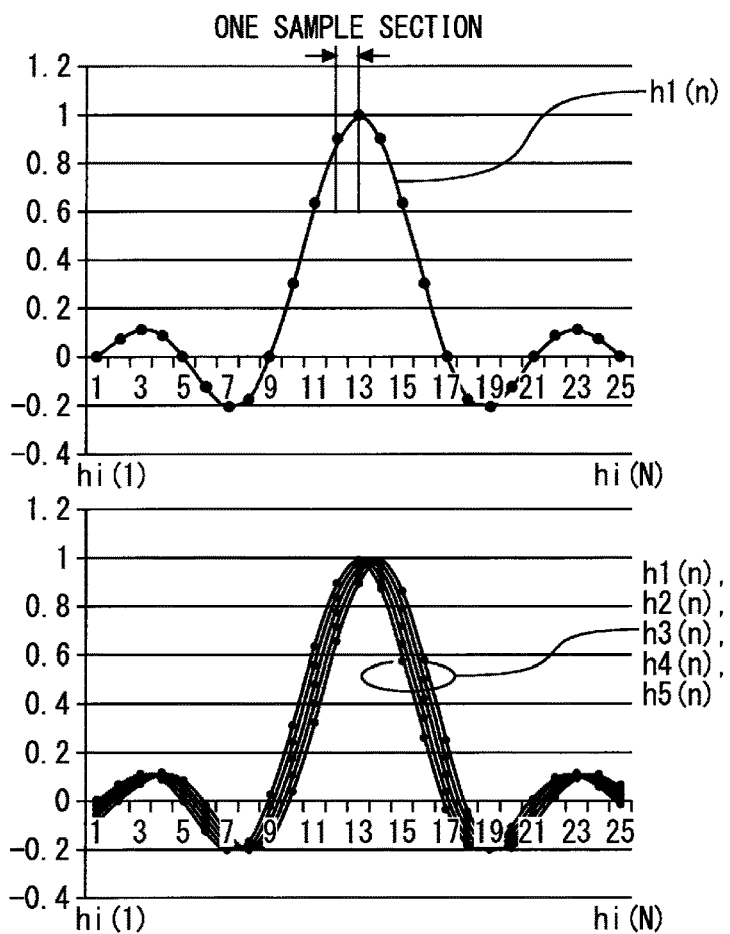
FIG. 5 is a diagram showing an example of the tap coefficients of the FIR filter according to the first embodiment of the present invention.

FIG. 5 is a diagram showing an example of the tap coefficients of the FIR filter according to the first embodiment of the present invention. An upper diagram shows a case where one tap coefficient group is provided. Plural tap coefficient groups may be prepared in advance in the tap coefficient adjuster 9 to be selectable as shown in a lower diagram. FIG. 5 shows a case where five kinds of tap coefficient groups are prepared according to the division of one sampling section into five parts. The shift adjustment can be more finely performed by dividing one sample section into 16 parts, 64 parts, 128 parts, etc. Furthermore, a large shifting amount is set at the initial stage of the processing and then a small shifting amount is set after convergence, whereby phase tracking can be performed at high speed and the fluttering width after phase tracking can be reduced.

Figure 6:
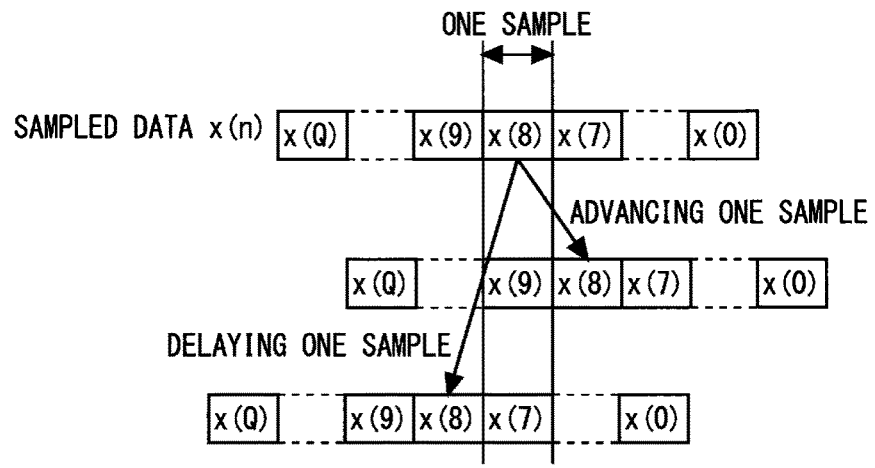
FIG. 6 is an explanatory diagram showing the operation of a data shift unit according to the first embodiment of the present invention.

FIG. 6 is an explanatory diagram showing the operation of a data shift unit according to the first embodiment of the present invention. The data shift unit 6 shifts sampled data input to the FIR filter 7 on a sample basis. A data shift controller 10 controls the data shift unit 6 to shift the sampled data by the amount corresponding to one sample (advance by one sample or delay by one sample) when the phase tracking amount in the FIR filter 7 exceeds one sample. In connection with this shift, the tap coefficient adjuster 9 returns the tap coefficients to the center values, whereby the phase tracking can be continuously performed.

Figure 7:
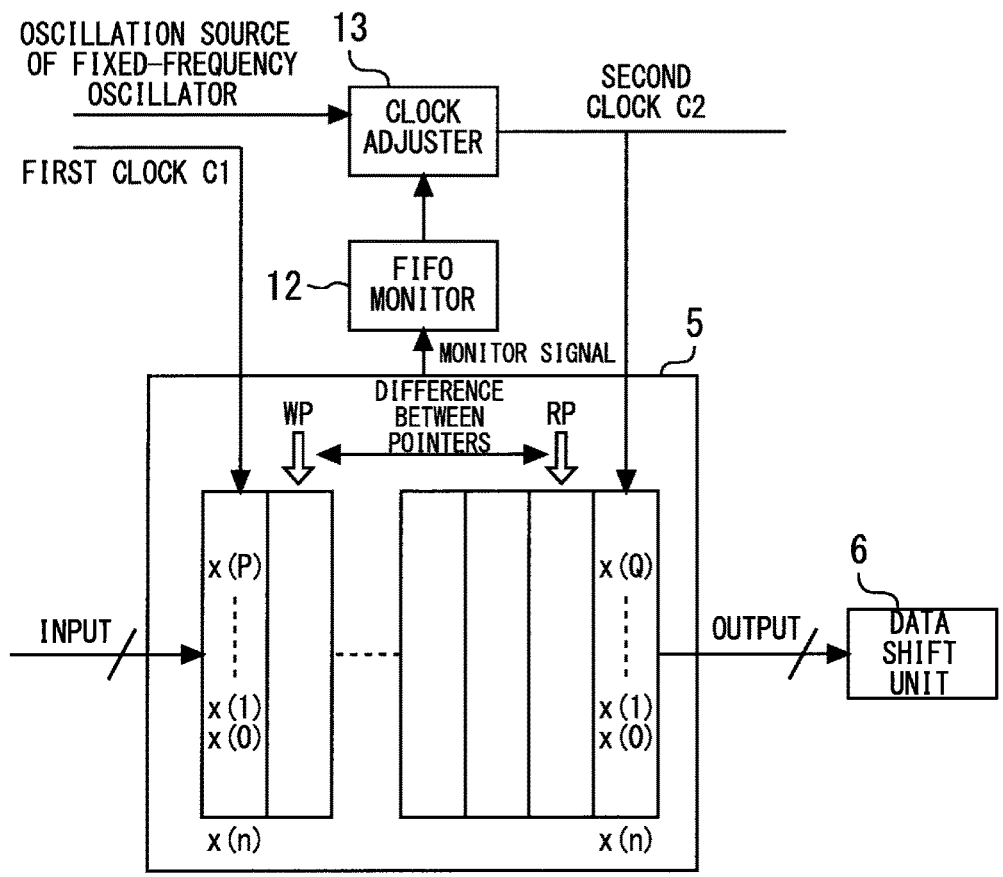
FIG. 7 is a diagram showing the internal configuration of FIFO according to the first embodiment of the present invention.

FIG. 7 is a diagram showing the internal configuration of FIFO according to the first embodiment of the present invention. FIFO 5 receives the sampled data converted to the parallel data in synchronization with the first clock C1, and writes the data into an internal memory. The location of this writing is represented as a write pointer WP. The sampled data are written and stored, and then read out in synchronization with the second clock C2 and supplied to the data shift unit 6. The location of this reading is represented as a read pointer RP. The difference between the write pointer WP and the read pointer RP corresponds to the amount of data held in FIFO 5.

An FIFO controller 11 updates the read pointer RP at the time when the shift amount of the data shift unit 6 reaches one parallel data number (the number of samples contained in one parallel data). At this time, the data shift controller 10 returns the shift amount of the data shift unit 6 to an initial value. As a result, phase tracking can be performed over plural parallel data.

Here, the processing at the front stage of FIFO 5 is performed in synchronization with the first clock C1, and the processing at the rear stage of FIFO 5 such as the processing of FIR filter 7, etc. is performed in synchronization with the second clock C2. The frequency of the first clock C1 may be equal to or different from the frequency of the second clock C2. In this embodiment, the frequency of the first clock C1 is set to 300 MHz, and the frequency of the second clock C2 is set to 400 MHz. In this case, the frequency of the second clock C2 is equal to four-thirds of the frequency of the first clock C1. By setting the frequency of the first clock C1 to a smaller value than the frequency of the second clock C2, the power consumption of the processing at the front stage of FIFO 5 can be reduced. The conversion of the clock frequency as described above accompanies the conversion of the sampling rate, and the data shift unit 6 and the FIFO 5 have a re-sampling function for converting the sampling rate.

An FIFO monitor 12 monitors data hold information of the FIFO 5. A clock adjuster 13 adjusts the frequency of the second clock C2 according to the data hold information so that the difference between the write pointer WP and the read pointer RP or the values thereof are converged at predetermined values.

For example, the FIFO monitor 12 monitors the difference between the pointers as the data hold information. When the amount of parallel data to be written in FIFO 5 is equal to the amount of parallel data to be read out from FIFO 5, the difference between the pointers is kept constant.

However, when a shift occurs in a phase advancing direction in the data shift unit 6 at the rear stage, the difference between the pointers decreases because the reading speed from FIFO 5 exceeds the writing speed. When the difference between the pointers falls below a lower limit value, FIFO 5 outputs an underflow signal to the FIFO monitor 12. The clock adjuster 13 lowers the frequency of the second clock C2 to reduce the reading speed from FIFO 5 so that the processing speed of circuits at the rear stage of FIFO 5 is delayed.

On the other hand, when a shift occurs in the phase delaying direction in the data shift unit 6 at the rear stage (that is, when no data is output), the reading speed from FIFO 5 falls down the writing speed, so that the difference between the pointers increases. When the difference between the pointers exceeds an upper limit value, FIFO 5 outputs an overflow signal to the FIFO monitor 12. The clock adjuster 13 increases the frequency of the second clock C2 to increase the reading speed from FIFO 5, so that the processing speed of the circuits at the rear stage of FIFO 5 increases.

As a result, a stationary state under which data held in FIFO 5 neither lack nor overflow can be maintained, and phase tracking can be continuously performed. The FIFO monitor 12 may monitor, as the data hold information, the shift of the center between the write pointer WP and the read pointer RP or the speed of the shift. In this case, the underflow signal or the overflow signal is output according to the shift of the center between the write pointer WP and the read pointer RP or the speed of the shift.

Figure 8:
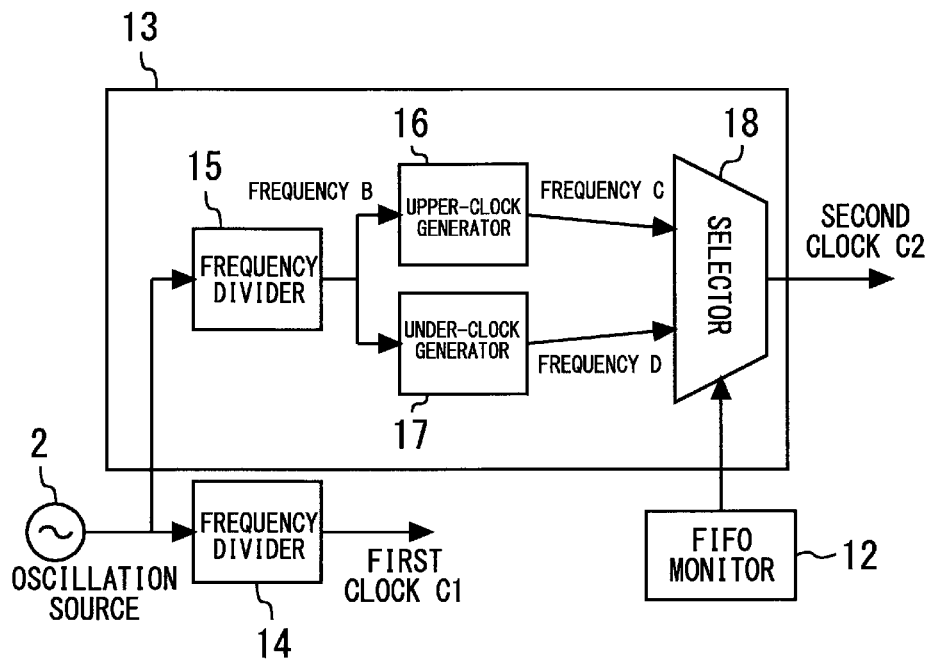
FIG. 8 is a diagram showing the clock adjuster according to the first embodiment of the present invention.
Figure 9:
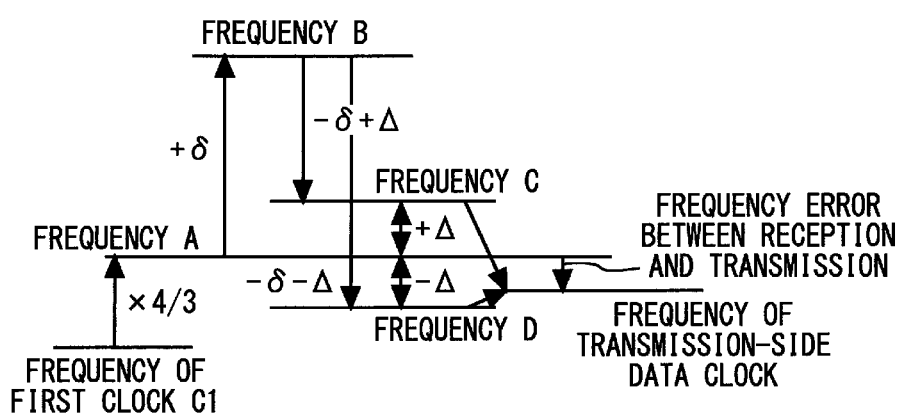
FIG. 9 is an explanatory diagram showing the operation of the clock adjuster according to the first embodiment of the present invention.

FIG. 8 is a diagram showing the clock adjuster according to the first embodiment of the present invention. FIG. 9 is an explanatory diagram showing the operation of the clock adjuster according to the first embodiment of the present invention. A frequency divider 14 divides the frequency of the oscillation source from the fixed-frequency oscillator 2 by N1 to generate the first clock C1. For the frequency of the oscillation source of 30 GHz and N1=100, the frequency of the first clock C1 is equal to 300 MHz.

The fixed-frequency oscillator 2 is an oscillator on the reception side, and generates a oscillation source having a fixed frequency. However, a frequency error between reception and transmission exists between the oscillator on the reception side and the oscillator on the transmission side. When the frequency error between reception and transmission is equal to 100 ppm, an error of 100 ppm also occurs in the sampling timing. The data shift speed in phase tracking corresponds to this value of 100 ppm.

When a frequency A is defined as the frequency which is equal to four-thirds of the frequency of the first clock C1, the frequency A is equal to 400 MHz. Since there exists a frequency error between reception and transmission as described above, it is difficult to make the frequency A coincident with the transmission-side data clock frequency. Therefore, the clock adjuster 13 adjusts the frequency of the second clock C2 as described below.

The frequency divider 15 divides the frequency of the oscillation source from the fixed-frequency oscillator 2 by N2. For N2=72, the frequency B of the output signal of the frequency divider 15 is equal to 416.66 . . . MHz. The frequency B is set to be higher than the frequency A by $\delta=4\%$. An upper-clock generator 16 generates an upper-clock UP having a frequency C of $-\delta+\Delta$ with respect to the frequency B. An under-clock generator 17 generates an under-clock UD having a frequency D of $-\delta-\Delta$ with respect to the frequency B.

The upper-clock generator 16 and the under-clock generator 17 have pulse masks for masking some of pulses of the output signal of the frequency divider 15. Since it is difficult to add pulses, two low frequencies C and D are generated by a method of temporarily generating a high frequency like the frequency B and then masking.

For example, when 417 pulses are masked during 10000 pulses for the output signal of the frequency divider 15, the frequency is lowered to 399.29 MHz, and this frequency is substantially equal to the frequency A. When (417−5) pulses are masked during 10000 pulses on the assumption that Δ is equal to 500 ppm, the frequency is lowered to 399.50 MHz, so that the frequency C which is higher than the frequency A by about 526 ppm can be generated. Furthermore, when (417+5) pulses are masked during 10000 pulses, the frequency is lowered to 399.08 MHz, and the frequency D which is lower than the frequency A by about 525 ppm can be generated. By properly masking pulses for the signal of the frequency B as described above, the frequencies C and D obtained by adding the frequency A with ±Δ can be generated. In this case, the frequency A has an error with respect to the transmission-side data clock frequency, and thus the frequencies C and D are required to be set so that the frequency C is higher than the transmission-side data clock frequency and the frequency D is lower than the transmission-side data clock frequency.

A selector 18 selects any one of the upper-clock UP and the under-clock UD according to the data hold information monitored by the FIFO monitor 12, and outputs the selected clock as the second clock C2. Specifically, when FIFO 5 is in an underflow state, the upper-clock UP is selected, and when FIFO 5 is in an overflow state, the under-clock UD is selected. Therefore, the frequency error between reception and transmission can be compensated and the data holding state of FIFO 5 can be kept stationary, so that the phase tracking can be continuously performed.

Figure 10:
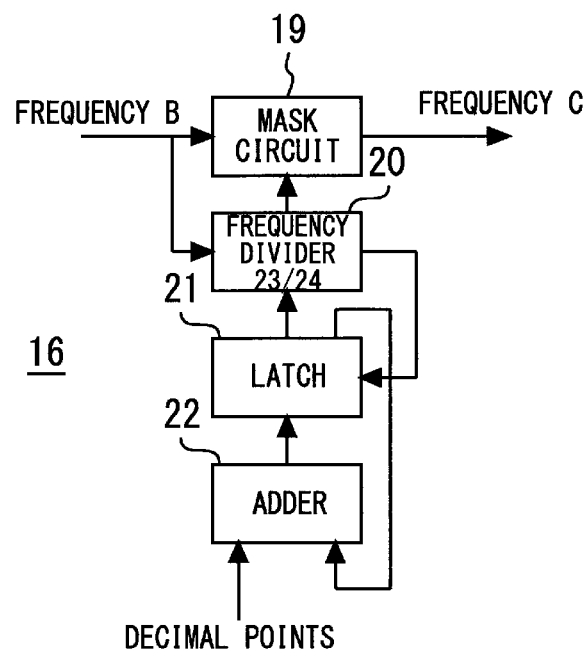
FIG. 10 is a diagram showing the upper-clock generator according to the first embodiment.
Figure 11:
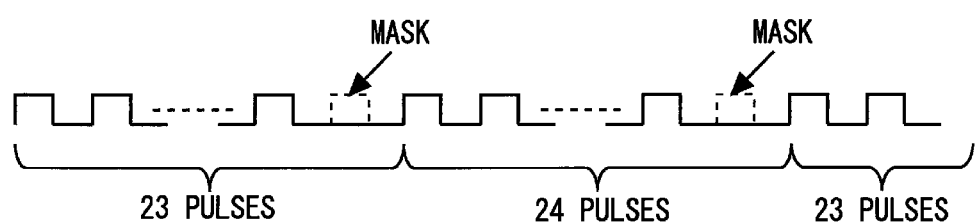
FIG. 11 is an explanatory diagram showing the operation of the upper-clock generator according to the first embodiment.

The upper-clock generator 16 and the under-clock generator 17 which mask (417±5) pulses for 10000 pulses can be simply configured by utilizing the operation principle of a numerically controlled oscillator (NCO: Numerically Controlled Oscillator) as described below. FIG. 10 is a diagram showing the upper-clock generator according to the first embodiment. FIG. 11 is an explanatory diagram showing the operation of the upper-clock generator according to the first embodiment. A mask circuit 19 masks one pulse every time the frequency divider 20 counts prescribed pulses of the clock as an input signal. Here, when 422 pulses are masked for 10000 pulses, one pulse is masked for every 10000/422=23.69668246. However, since the pulses are counted on an integer basis, decimal points are accumulated by a latch 21 and an adder 22 every time 23 pulses are counted, and when the accumulated decimal points becomes an integer, one pulse is masked upon counting of 24 pulses, whereby pulses of every rational number can be masked. When pulses of a clock are masked, the phase of the clock is drastically disturbed. However, with respect to the second clock C2, the sampling timing itself is not adjusted, but the reading speed from FIFO 5 is controlled, so that it is possible to perform frequency adjustment by a simple method such as pulse masking. The under-clock generator 17 have the same configuration and operation as described above.

Figure 12:
FIG. 12 is an explanatory diagram showing the operation of the clock waveform shaper according to the first embodiment of the present invention.
Figure 12:
Figure 12:

Large jitter exists in the second clock C2 output from the clock adjuster 13 because some pulses thereof are masked. Therefore, the second clock C2 output from the clock adjuster 13 is subjected to waveform shaping by the clock waveform shaper 23 to reduce the jitter. FIG. 12 is an explanatory diagram showing the operation of the clock waveform shaper according to the first embodiment of the present invention. The clock waveform shaper 23 has the function of a jitter cleaner for making the period substantially uniform. The jitter cleaner may be easily configured by a filter or digital processing using another clock. A clock whose jitter is reduced by the clock waveform shaper 23, and an output signal of the FIR filter 7 which is tracked to the synchronization timing are output to a decoder and subjected to decoding processing.

As described above, this embodiment detects the phase difference between the synchronization timing of the signal waveform estimated from the output signal of the FIR filter 7 and the sampling timing of the output signal. The tap coefficients are adjusted so as to reduce this phase difference, whereby the sampling timing of the output signal of the FIR filter 7 is caused to track the synchronization timing.

A general clock recovery circuit alternately adjusts delay and advance in clock phase between reception and transmission on a real-time basis, and adjusts the frequency and phase of the sampling clock itself to perform synchronous processing. On the other hand, in this embodiment, tracking in one direction is continuously performed without alternate adjustment of delay and advance in phase. In this case, external circuits such as analog VCO, a filter and a DA converter are not required because digital processing is possible. Accordingly, the configuration of the device can be simplified.

In radio communication for communicating relative low-frequency signals, a sampling clock can be generated from a high frequency, and the frequency and phase of the sampling clock can be finely adjusted. However, this method is not applicable to optical communication, etc. which communicate high-frequency signals. Accordingly, according to this embodiment, phase tracking is continued while the second clock C2 as the sampling clock and the transmission-side data clock are shifted from each other in frequency, as follows, the error in frequency is adjusted based on the speed of the process of sending data. Accordingly, it is unnecessary to subject the sampling clock to frequency synchronization. Therefore, the data phase tracking device according to this embodiment is applicable to an optical communication device or a radio communication device that communicates high-frequency signals.

Second Embodiment

Figure 13:
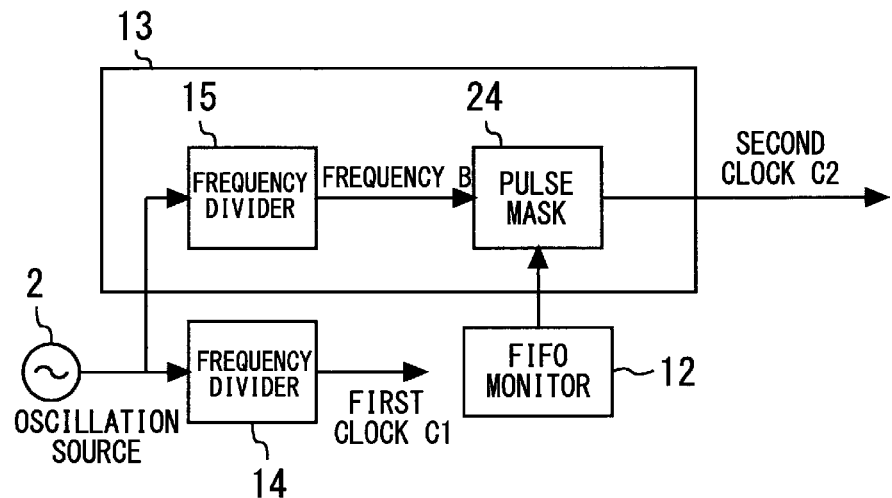
FIG. 13 is a diagram showing a clock adjuster according to a second embodiment of the present invention.

FIG. 13 is a diagram showing a clock adjuster according to a second embodiment of the present invention. A pulse mask 24 masks some of pulses of the output signal of the frequency divider 15 to generate a second clock C2. The pulse mask 24 adjusts the amount of pulses to be masked according to data hold information monitored by the FIFO monitor 12.

Figure 14:
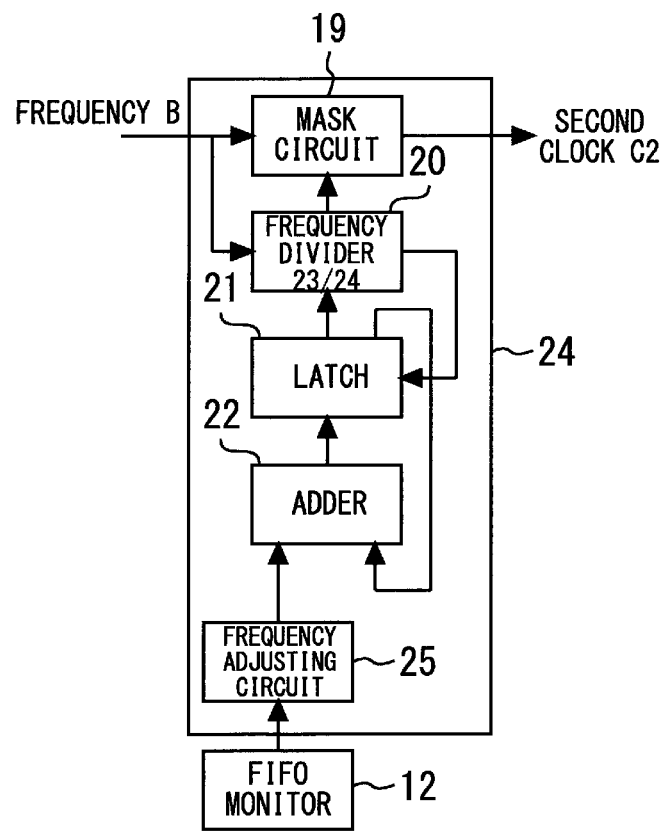
FIG. 14 is a diagram showing the pulse mask according to the second embodiment of the present invention.

FIG. 14 is a diagram showing the pulse mask according to the second embodiment of the present invention. The pulse mask has the same basic configuration as the upper-clock generator 16 of the first embodiment, but an output signal of a frequency adjusting circuit 25 is input as input data of an adder 22. For example, a portion of decimal points of 10000/417=23.98081535 corresponding to the frequency A is set as an initial value of the output of the frequency adjusting circuit 25. Accordingly, when the set value of the decimal points is fixed at all times, the frequency of the second clock C2 is substantially equal to the frequency A. At this time, for example when the frequency is lowered by 10 ppm, (417+0.1) pulses may be masked. Since 10000/471.1 is equal to 23.97506593, 0.005749 is subtracted from the value of the decimal points corresponding to the frequency A. That is, the frequency can be adjusted at an interval of 10 ppm by adding or subtracting the above value.

The output signal of the frequency adjusting circuit 25 can be generated based on information from the FIFO monitor 12. For example, when FIFO 5 is in the underflow state, it is determined that the frequency of the second clock C2 is larger than the transmission-side data clock frequency, and the value corresponding to 10 ppm described above is subtracted from the value of the decimal points corresponding to the frequency A to reduce the frequency of the second clock C2. By repeating this calculation, the second clock C2 can be converged at a frequency which is lower than the frequency A by the amount corresponding to the frequency error between reception and transmission.

The output signal of the frequency adjusting circuit 25 may be generated based on information from the phase difference detector 8, the tap coefficient adjuster 9, the data shift controller 10 or the FIFO controller 11. In the case where the frequency error between reception and transmission can be directly detected by FFT analysis in the phase difference detector 8, the output signal of the frequency adjusting circuit 25 could be easily calculated from the detection value.

In this embodiment, some pulses of the second clock C2 output from the clock adjuster 13 are also masked, and thus large jitter exists therein. Therefore, as in the case of the first embodiment, the second clock C2 output from the clock adjuster 13 is subjected to waveform shaping by the clock waveform shaper 23 to reduce the jitter.

Third Embodiment

Figure 15:
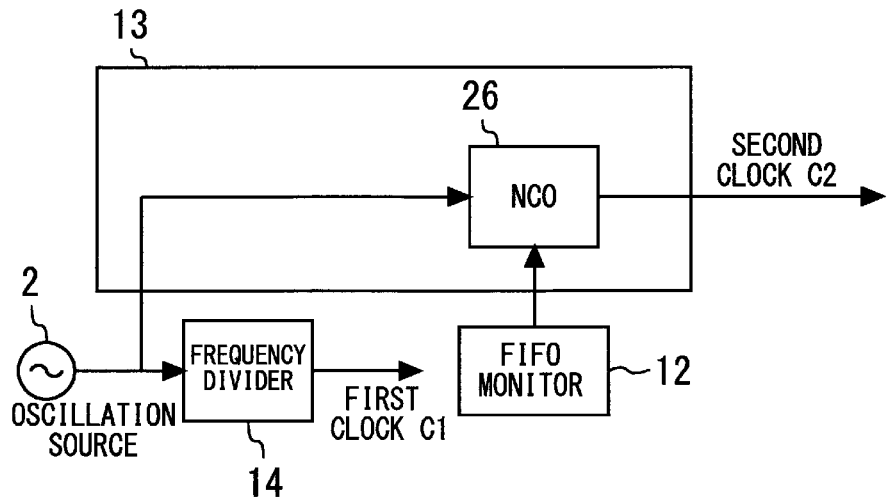
FIG. 15 is a diagram showing the clock adjuster according to a third embodiment of the present invention.

FIG. 15 is a diagram showing the clock adjuster according to a third embodiment of the present invention. The clock adjuster 13 has a numerically controlled oscillator 26 (NCO: Numerically Controlled Oscillator) for directly converging the second clock C2 to the transmission-side data clock frequency to generate the second clock C2 from the oscillation source of the fixed-frequency oscillator 2.

Figure 16:
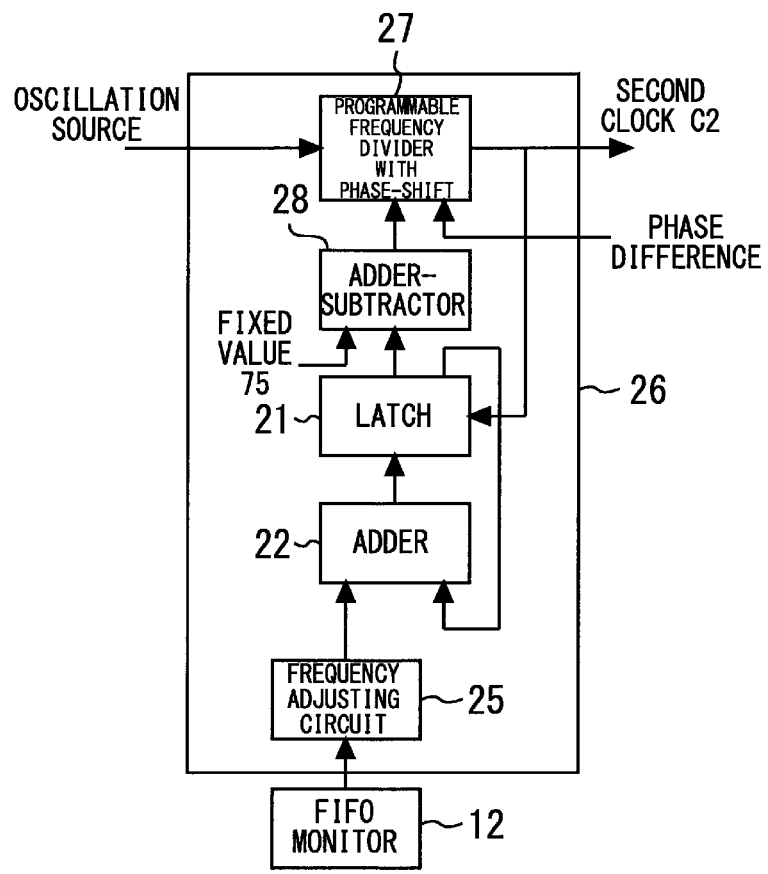
FIG. 16 is a diagram showing the numerically controlled oscillator according to the third embodiment of the present invention.

FIG. 16 is a diagram showing the numerically controlled oscillator according to the third embodiment of the present invention. A programmable frequency divider with phase-shift 27 divides the frequency of the oscillation source by a frequency division number set by an adder-subtractor 28 to generate the second clock C2. When the second clock C2 of 400 MHz is generated from the oscillation source of 30 GHz, the frequency is divided by 75. However, the second clock C2 has an error of, for example, ±100 ppm at maximum with respect to the transmission-side data clock frequency.

When the output of the frequency adjusting circuit 25 is equal to zero, the accumulated value also becomes zero, and the output of the adder-subtractor 28 is equal to 75. Therefore, the programmable frequency divider with phase-shift 27 divides the frequency of the oscillation source by 75. When −0.1 is set as the output of the frequency adjusting circuit 25, the frequency is divided by 74.9, so that the frequency of the second clock C2 is equal to 400.534045 MHz. This value indicates +1335 ppm for 400 MHz. For setting of −0.001, it indicates +13.3 ppm. As described above, the frequency of the second clock C2 can be adjusted, for example, in terms of about 10 ppm (which may be further lowered or heightened) based on the values of the frequency adjusting data.

For example, when FIFO 5 is in the underflow state, it is determined that the frequency of the second clock C2 is larger than the transmission-side data clock frequency, and the output of the frequency adjusting circuit 25 is added with a predetermined value to lower the frequency of the second clock C2. The predetermined value may be set such that setting is initially started from several hundreds of ppm and then several tens of ppm are set under a converged state. As a result, the second clock C2 can be converged at a frequency which is lower than the frequency A by the amount corresponding to the frequency error between reception and transmission.

Apart from the overflow state and the underflow state, information to be monitored by the FIFO monitor 12 may be also output when FIFO 5 has a predetermined data hold width state as a medium state between the overflow and underflow states. In this case, when the frequency is converged, it can be stabilized by reducing the frequency of control. As in the case of the second embodiment, the output signal of the frequency adjusting circuit 25 may be generated based on information from the phase difference detector 8, the tap coefficient adjuster 9, the data shift controller 10 or the FIFO controller 11. When the frequency error between reception and transmission can be directly detected by FFT analysis in the phase difference detector 8, the output signal of the frequency adjusting circuit 25 can be easily calculated from the detection value.

The programmable frequency divider with phase-shift 27 can directly shift the phase of the second clock C2 to the phase of the transmission-side data clock based on the phase difference extracted by the phase difference detector 8. Therefore, it is possible to increase the synchronization speed and deal with a burst signal.

Fourth Embodiment

Figure 17:
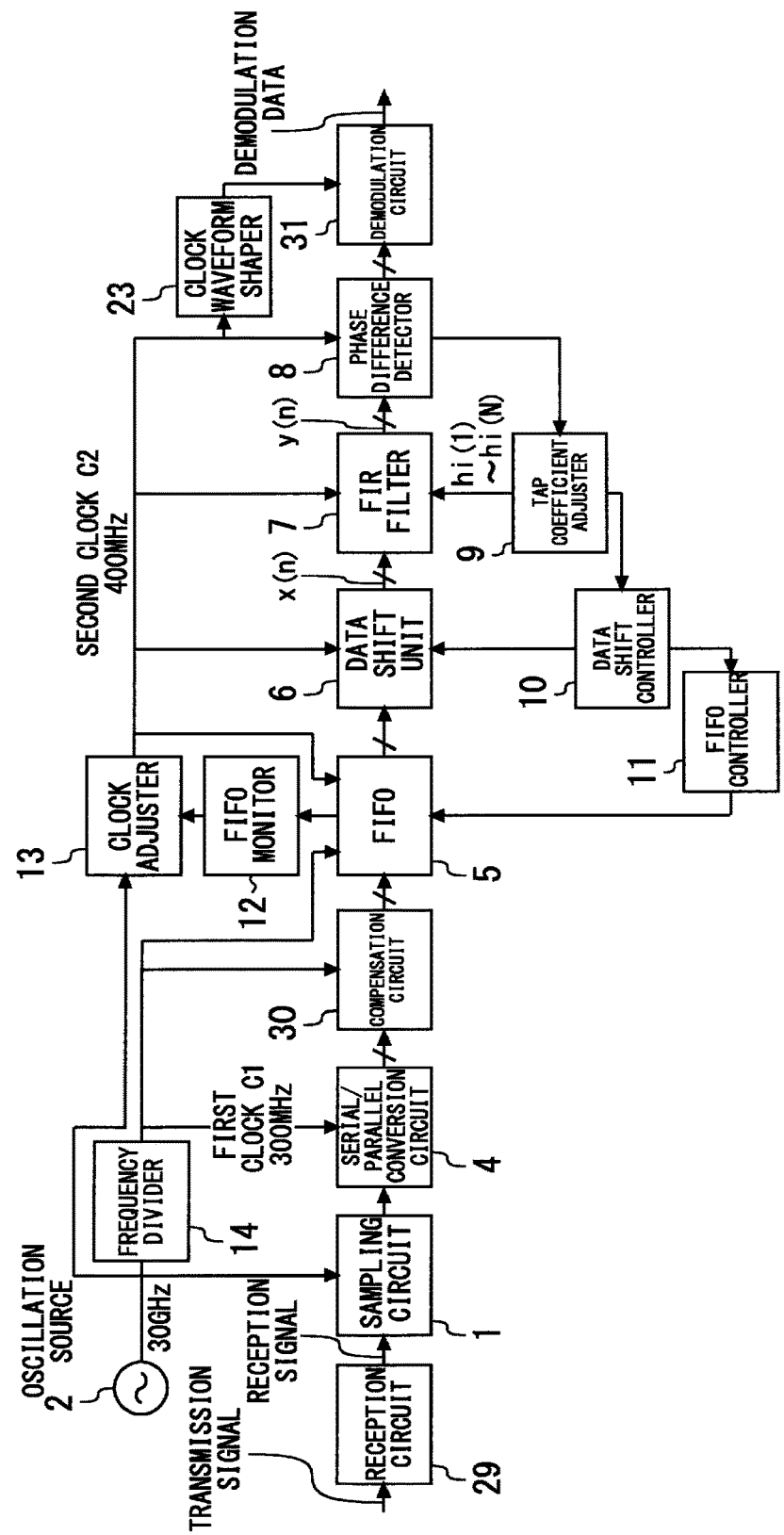
FIG. 17 is a diagram showing a communication device according to a fourth embodiment of the present invention.

FIG. 17 is a diagram showing a communication device according to a fourth embodiment of the present invention. The communication device is an optical communication device or radio communication device for receiving and demodulating an optical or radio transmission signal. A reception circuit 29 receives a transmission signal, converts the transmission signal to an analog electrical signal and transmitting the analog electrical signal as a reception signal. The configuration and processing method of the data phase tracking device containing the elements from the sampling circuit 1 to the clock waveform shaper 23 are the same as the first to third embodiments.

A compensation circuit 30 is provided between the serial/parallel conversion circuit 4 and FIFO 5. The compensation circuit 30 performs compensation of propagation characteristics on parallel data of 1.5 sample/symbol, and thereafter FIFO 5 performs up-sampling (re-sampling) on 2 sample/symbol, whereby power consumption required for the processing by the compensation circuit 30 can be more greatly reduced than power consumption required for the compensation circuit 30 to process parallel data of 2 sample/symbol. Particularly, the effect is greater when the compensation circuit 30 performs much processing without the FIR filter configuration such that data are once transformed to a frequency region by the FFT (Fast Fourier Transform) processing, subjected to compensation processing such as multiplication with a transfer function, etc. in the frequency region, and then returned to a time region by IFFT (Inverse Fast Fourier Transform) again.

The output signal of the phase difference detector 8 is demodulated by a demodulation circuit 31 to output demodulation data. As described above, the present invention is applicable to an optical communication device or a radio communication device. Particularly, the present invention is applicable to a data processing circuit of a communication device that performs sampling asynchronously.

A program for implementing the function of the data phase tracking device according to the first to third embodiment may be recorded in a computer-readable recording medium so that the program recorded in the recording medium is read in and executed by a computer system or a programmable logic device to perform the processing of the data phase tracking device. The "computer system" described here may contain hardware such as OS, peripheral equipment, etc. The "computer system" may contain a WWW system having a homepage providing environment (or displaying environment). The "computer-readable recording medium" may be a portable medium such as a flexible disc, a magneto-optic disc, ROM and CD-ROM, or a storage device such as a hard disc incorporated in a computer system. Furthermore, the "computer-readable recording medium" may contain an element for holding a program for a constant time like a volatile memory (RAM) in a computer system serving as a server or a client when a program is transmitted through a network such as the Internet or a communication line such as a telephone line. The program may be transmitted from a computer system having a storage device or the like in which the program is stored, to another computer system via a transmission medium or by transmission waves in a transmission medium. Here, the "transmission medium" for transmitting the program is a medium having a function of transmitting information like a network (communication network) such as the Internet or a communication circuit (communication line) such as a telephone line or the like. The program may be provided to perform a part of the foregoing function. Furthermore, the program may be provided to perform the foregoing function in combination with a program which has been already stored in the computer system, so-called a differential file (differentia program).

REFERENCE SIGNS LIST 1 sampling circuit; 4 serial/parallel conversion circuit; 5 FIFO; 6 data shift unit; 7 FIR filter; 8 phase difference detector; 9 tap coefficient adjuster; 10 data shift controller; 11 FIFO controller; 12 FIFO monitor; 13 clock adjuster; 16 upper-clock generator; 17 under-clock generator; 18 selector; 23 clock waveform shaper; 24 pulse mask; 26 numerically controlled oscillator; 29 reception circuit; 31 demodulation circuit

The invention claimed is:

1. A data phase tracking device comprising:
a memory storing sampled data obtained by sampling a reception signal in synchronization with a first clock;
an FIR filter reading out the sampled data from the memory and convoluting the sampled data with tap coefficients in synchronization with a second clock;
a phase difference detector estimating a synchronization timing for decoding a signal waveform from an output signal of the FIR filter and detecting a phase difference between the synchronization timing and a sampling timing of the output signal;
a tap coefficient adjuster adjusting the tap coefficients so as to reduce the phase difference detected by the phase difference detector and causing the sampling timing of the output signal of the FIR filter to track the synchronization timing; and a clock adjuster adjusting a frequency of the second clock according to data hold information of the memory in which storing and reading of the sampled data is performed according to a phase tracking amount of the tap coefficient adjuster, wherein the sampling timing is continuously tracked to the synchronization timing.

2. The data phase tracking device according to claim 1, wherein the tap coefficient adjuster controls the tap coefficients to shift a phase of the output signal of the FIR filter with accuracy smaller than one sample section.

3. The data phase tracking device according to claim 2, further comprising:
a data shift unit shifting the sampled data input to the FIR filter on a sample basis; and
a data shift controller controlling the data shift unit to shift the sampled data by an amount corresponding to one sample when a phase tracking amount in the FIR filter exceeds one sample,
wherein when the data shift unit shifts the sampled data by the amount corresponding to one sample, the tap coefficient adjuster returns the tap coefficients to a center value.

4. A communication device comprising;
a reception circuit receiving a transmission signal, converting the transmission signal to the reception signal and transmitting the reception signal;
a sampling circuit sampling the reception signal to generate the sampled data;
the data phase tracking device according claim 1; and
a demodulation circuit demodulating the output signal of the FIR filter and outputting demodulation data.

5. A data phase tracking device comprising:
an FIR filter convoluting sampled data obtained by sampling a reception signal with tap coefficients;
a phase difference detector estimating a synchronization timing for decoding a signal waveform from an output signal of the FIR filter and detecting a phase difference between the synchronization timing and a sampling timing of the output signal;
a tap coefficient adjuster adjusting the tap coefficients so as to reduce the phase difference detected by the phase difference detector and causing the sampling timing of the output signal of the FIR filter to track the synchronization timing;
a data shift unit shifting the sampled data input to the FIR filter on a sample basis;
a data shift controller controlling the data shift unit to shift the sampled data by an amount corresponding to one sample when a phase tracking amount in the FIR filter exceeds one sample;
a serial/parallel conversion circuit converting the sampled data to parallel data;
an FIFO writing the sampled data converted to the parallel data into a write pointer point in synchronization with a first clock, reading out the sampled data from a read pointer point in synchronization with a second clock and supplying the sampled data to the data shift unit; and
an FIFO controller updating the read pointer when a shift amount of the unit reaches one parallel data number,
wherein the tap coefficient adjuster controls the tap coefficients to shift a phase of the output signal of the FIR filter with accuracy smaller than one sample section,
when the data shift unit shifts the sampled data by the amount corresponding to one sample, the tap coefficient adjuster returns the tap coefficients to a center value, and
when the read pointer is updated, the data shift controller returns the shift amount of the data shift unit to an initial value.

6. The data phase tracking device according to claim 5, further comprising:
an FIFO monitor monitoring data hold information of the FIFO; and
a clock adjuster adjusting frequency of the second clock according to the data hold information.

7. The data phase tracking device according to claim 6, wherein the clock adjuster adjusts a frequency of the second clock so that a difference between the write pointer and the read pointer or values of the write pointer and the read pointer are converged at predetermined values.

8. The data phase tracking device according to claim 6, wherein the FIFO monitor monitors a difference between the write pointer and the read pointer as the data hold information,
when the difference falls below a lower limit value, the clock adjuster lowers the frequency of the second clock, and
when the difference exceeds an upper limit value, the clock adjuster increases the frequency of the second clock.

9. The data phase tracking device according to claim 6, wherein the FIFO monitor monitors, as the data hold information, a shift of a center between the write pointer and the read pointer or speed of the shift.

10. The data phase tracking device according to claim 6, wherein the clock adjuster includes:
an upper-clock generator generating an upper-clock having a frequency higher than a frequency of the estimated signal waveform;
an under-clock generator generating an under-clock having a frequency lower than a frequency of the estimated signal waveform; and
a selector selecting any one of the upper-clock and the under-clock according to the data hold information and outputting the selected clock as the second clock.

11. The data phase tracking device according to claim 10, wherein at least one of the upper-clock generator and the under-clock generator include a pulse mask masking some of pulses of a predetermined clock.

12. The data phase tracking device according to claim 6, wherein the clock adjuster includes a pulse mask masking some of pulses of a predetermined clock, and
the pulse mask adjusts an amount of pulses to be masked according to data hold information.

13. The data phase tracking device according to claim 11, further comprising a clock waveform shaper reducing a jitter of the second clock output from the clock adjuster.

14. The data phase tracking device according to claim 6, wherein the clock adjuster has a numerically controlled oscillator generating the second clock from a predetermined clock.

15. The data phase tracking device according to claim 5, wherein the data shift unit and the FIFO have a re-sampling function for converting a sampling rate.

16. A data phase tracking method performed by a data phase tracking device comprising:
storing sampled data obtained by sampling a reception signal in synchronization with a first clock in a memory, reading out the sampled data from the memory and convoluting the sampled data with tap coefficients to generate an output signal in synchronization with a second clock;

estimating a synchronization timing for decoding a signal waveform from the output signal and detecting a phase difference between the synchronization timing and a sampling timing of the output signal;

adjusting the tap coefficients so as to reduce the detected phase difference and causing the sampling timing of the output signal to track the synchronization timing; and adjusting a frequency of the second clock according to data hold information of the memory in which storing and reading of the sampled data is performed according to a phase tracking amount of adjusting the tap coefficients, wherein the sampling timing is continuously tracked to the synchronization timing.

* * * * *